United States Patent
Nakai

(10) Patent No.: US 7,742,332 B2
(45) Date of Patent: Jun. 22, 2010

(54) PHASE-CHANGE RANDOM ACCESS MEMORY DEVICE AND SEMICONDUCTOR MEMORY DEVICE

(75) Inventor: Kiyoshi Nakai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 120 days.

(21) Appl. No.: 12/222,953

(22) Filed: Aug. 20, 2008

(65) Prior Publication Data

US 2009/0052234 A1 Feb. 26, 2009

(30) Foreign Application Priority Data

Aug. 21, 2007 (JP) ............................ P2007-214521

(51) Int. Cl.
 *G11C 11/00* (2006.01)
(52) U.S. Cl. ..................... 365/163; 365/185.05; 257/2
(58) Field of Classification Search ................. 365/163, 365/63, 185.05; 257/314, 306, 2
 See application file for complete search history.

(56) References Cited

U.S. PATENT DOCUMENTS

| | | | |
|---|---|---|---|
| 6,924,525 B2 * | 8/2005 | Narui et al. .................. 257/306 |
| 2005/0270883 A1 | 12/2005 | Cho et al. | |
| 2007/0111429 A1 * | 5/2007 | Lung ........................... 438/238 |
| 2007/0181932 A1 * | 8/2007 | Happ et al. .................. 257/314 |

OTHER PUBLICATIONS

Kang, D.H., et al., "Novel Heat Dissipating Cell Scheme for Improving a Reset Distribution in a 512M Phase-change Random Access Memory (PRAM)", Symposium on VLSI Technology Digest of Technical Papers, 2007, pp. 96-97.

* cited by examiner

*Primary Examiner*—Son Dinh
(74) *Attorney, Agent, or Firm*—McGinn IP Law Group, PLLC

(57) ABSTRACT

A semiconductor memory device includes: first and second wiring layers extending in substantially parallel to each other in a first direction; a first semiconductor region formed in a part of a portion between the first and second wiring layers; a second semiconductor region formed on an opposite side to the first semiconductor region with respect to the second wiring layer and making a pair with the first semiconductor region; a third semiconductor region formed in another part of the portion between the first and second wiring layers; a fourth semiconductor region formed on an opposite side to the third semiconductor region with respect to the first wiring layer and making a pair with the third semiconductor region; a third wiring layer extending in a second direction that crosses the first direction and having an electrical contact with the first semiconductor region; a fourth wiring layer extending in the second direction and having an electrical contact with the fourth semiconductor region; a fifth wiring layer extending in the first direction to cross over the first and third semiconductor regions.

15 Claims, 9 Drawing Sheets

PHASE-CHANGE RANDOM ACCESS MEMORY DEVICE AND SEMICONDUCTOR MEMORY DEVICE

BACKGROUND OF THE INVENTION

1. Field of the Invention

The present invention relates to a phase-change random access memory device and a semiconductor memory device including a memory cell structure in which phase-change elements and diodes are connected in series.

Priority is claimed on Japanese Patent Application No. 2007-214521, filed Aug. 21, 2007, the content of which is incorporated herein by reference.

2. Description of Related Art

A phase-change random access memory (PRAM) device is attracting attention as a nonvolatile memory capable of high-speed writing. However, a PRAM device has a disadvantage of requiring comparatively high current when writing to the memory cell. When memory cell is selected by using a metal oxide semiconductor (MOS) transistor which requires large write current, the layout size of the switching MOS transistor increases in order to secure write current while the size of the phase-change elements constituting the memory cell can be reduced. To secure write current with a small cell size, a memory cell structure called "diode matrix ROM" is proposed, in which phase-change elements and diodes are connected in series.

FIG. 7 is a memory cell structure of a diode matrix ROM. FIG. 8 is a cross-sectional view of the memory cell structure shown in FIG. 7. FIG. 9 is an equivalent circuit of the memory cell structure shown in FIG. 7.

As shown in FIGS. 7, 8, and 9, in this memory cell structure, a pn junction diode 203 is formed on a diffusion layer 202 embedded in a silicon (Si) substrate 201. A bottom electrode 206 is formed on the diode 203 with a contact 204 and a mid-contact 205 in between. A phase-change film (GST {GeSbTe} film) 207 is formed on the bottom electrode 206. A top electrode 208 is formed on the phase-change film 207. Forming the bottom electrode 206, the phase-change film 207, and the top electrode 208 in this manner obtains a phase-change element 209 that is connected in series to the diode 203. A memory cell MC is constituted by connecting the phase-change element 209 in series with the diode 203. A memory cell MC is arranged at each point of intersection between a diffusion layer 202 forming a word line WL and a top electrode 208 forming a bit line BL. The bottom electrode 206 is formed as a heat plug (a section which heats by current-concentration) for generating phase-change. In this memory cell structure, write current is reduced by providing an insulating film (side wall) 210 inside the opening where the bottom electrode 206 is arranged, making the heater smaller than the opening diameter.

Such a diode matrix ROM memory cell structure is known as a cross-point cell structure, and can realize a minimum cell area, specifically a cell size of $4F^2$ (where F is a minimum feature size of a process).

With this memory cell structure, one effect of reducing the cell size is that write current concentrates in the word line (ground line) WL. When memory cells (bits) on a same word line are selected, current for simultaneous writing concentrates in the word line WL. As a result, the resistance of the word line WL causes its potential to increase, whereby the write current of each bit decreases.

For example, in FIG. 9, two memory cells on the same word line WL are in write status. Here, among the plurality of bit lines BL along the vertical direction, the selected bit lines BL are indicated by H (thick solid line) and the unselected bit lines BL are indicated by L (thin solid line). Among the word lines WL along the horizontal direction, the selected word line WL is indicated by L (thick solid line), and the unselected word lines WL are indicated by H (thin solid line). As indicated by the broken line in FIG. 9, write current flows from the two selected bit lines BL and through the memory cells MC to the selected word line WL. Therefore in this case, write current from two memory cells MC concentrates in one word line WL. Therefore, twice the current required for writing each memory cell MC flows to one word line WL.

Since a phase-change random access memory device generally requires a large write current of approximately 500 μA to several mA, when current concentrates in a word line WL, the potential of the word line WL increases greatly. When performing reading, this concentration of current in the word line WL leads to a rise in the potential of the word line WL, which adversely affects the data sensing operation. A phase-change random access memory device has a comparatively long writing time (approximately several ten ns to several hundred ns). Therefore, when the phase-change random access memory device is used as a memory cell MC for applications with a short read/write cycle such as a DRAM, there is a possibility of mixture of read/write operations. Specifically, it is conceivable that, a read of one memory cell MC is performed on a word line WL, while a write of a different memory cell MC on the same word line WL is performed. In this case, since a large current is required for writing, concentration of this write current makes the potential of the word line WL increase. Consequently, the required voltage is not applied to the phase-change element 209 of a different memory cell MC on the same word line WL and the current for reading decreases, making reading impossible or reducing the read speed.

Currently there is a demand for semiconductor memories to perform multi-bit and high-speed reading and writing. There is a consequent trend toward increasing the number of bits to which reading/writing is performed simultaneously. As the number of bits increases, more bits are activated within same mats (regions having common ground lines), which generates more current concentration.

Accordingly, to prevent such concentration of write current in word lines WL, United States Patent Application, Publication No. 2005-270883 and 'Novel Heat Dissipating Cell Scheme for Improving a Reset Distribution in a 512M Phase-change Random Access Memory (PRAM)', VLSI Symposium 2007 disclose a configuration for arranging a MOS transistor below a memory cell MC. Specifically, in this configuration, two, four, or eight memory cells MC are connected in a single MOS transistor. Since the current travels in the direction of the bit lines BL instead of the word lines WL, concentration of current can be avoided.

However, when the MOS transistor is arranged below the memory cells MC in this manner, limitation regarding the layout of the MOS transistor results in a cell size of $6F^2$. This results in a problem that the cell is larger than the $4F^2$ case above.

SUMMARY

The present invention seeks to solve one or more of the above problems, or to improve upon those problems at least in part.

In one embodiment, there is provided a semiconductor memory device includes: first and second wiring layers extending in substantially parallel to each other in a first direction; a first semiconductor region formed in a part of a portion that is between the first and second wiring layers; a second semiconductor region formed on an opposite side to the first semiconductor region with respect to the second wiring layer and making a pair with the first semiconductor region; a third semiconductor region formed in another part of the portion that is between the first and second wiring layers; a fourth semiconductor region formed on an opposite side to the third semiconductor region with respect to the first wiring layer and making a pair with the third semiconductor region; a third wiring layer extending in a second direction that crosses the first direction and having an electrical contact with the first semiconductor region; a fourth wiring layer extending in the second direction and having an electrical contact with the fourth semiconductor region; a fifth wiring layer extending in the first direction to cross over the first and third semiconductor regions; a sixth wiring layer extending in the first direction in substantially parallel to the fifth wiring layer to cross over the second semiconductor region; a plurality of seventh wiring layers extending in the second direction in substantially parallel to one another, each of the seventh wiring layers intersecting each of the fifth and sixth wiring layers; a plurality of first memory elements each disposed at an intersection of an associated one of the seventh wiring layers and the fifth wiring layer; and a plurality of second memory elements each disposed at an intersection of an associated one of the seventh wiring layers and the sixth wiring layer.

As described above, the semiconductor memory device according to the embodiments of the invention enables the cell size to be reduced, and prevented concentration of read/write current in same first and second wiring layers due to increase in the number of the seventh wiring layers to which reading/writing is performed simultaneously, whereby read/write operations can be performed at high speed.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
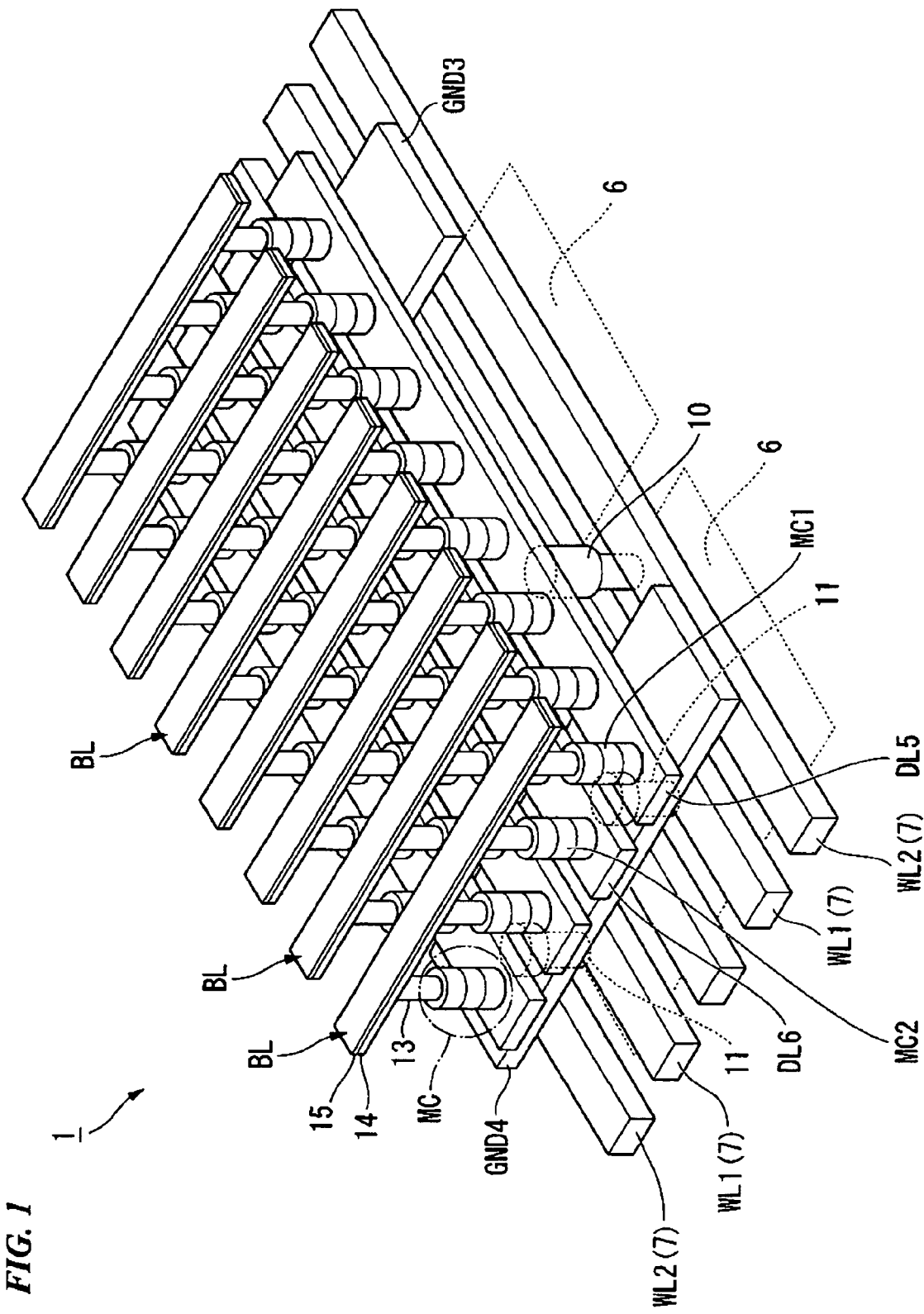
FIG. 1 is a perspective view showing a memory cell structure of a phase-change random access memory device according to a first embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the drawings used in the following explanation, characteristic portions are in some cases enlarged to facilitate understanding of phase-change random access memory devices according to embodiments of the invention. Therefore, size ratios and the like of the constituent parts are not necessarily the same as they are in reality. Materials, sizes, and the like in the following explanation are examples, which are not limitative of the invention and can be modified in various ways without departing from the spirit or scope of the present invention.

A semiconductor memory device according to an embodiment includes: first and second wiring layers extending in substantially parallel to each other in a first direction; a first semiconductor region formed in a part of a portion that is between the first and second wiring layers; a second semiconductor region formed on an opposite side to the first semiconductor region with respect to the second wiring layer and making a pair with the first semiconductor region; a third semiconductor region formed in another part of the portion that is between the first and second wiring layers; a fourth semiconductor region formed on an opposite side to the third semiconductor region with respect to the first wiring layer and making a pair with the third semiconductor region; a third wiring layer extending in a second direction that crosses the first direction and having an electrical contact with the first semiconductor region; a fourth wiring layer extending in the second direction and having an electrical contact with the fourth semiconductor region; a fifth wiring layer extending in the first direction to cross over the first and third semiconductor regions; a sixth wiring layer extending in the first direction in substantially parallel to the fifth wiring layer to cross over the second semiconductor region; a plurality of seventh wiring layers extending in the second direction in substantially parallel to one another, each of the seventh wiring layers intersecting each of the fifth and sixth wiring layers; a plurality of first memory elements each disposed at an intersection of an associated one of the seventh wiring layers and the fifth wiring layer; and a plurality of second memory elements each disposed at an intersection of an associated one of the seventh wiring layers and the sixth wiring layer.

Moreover, in the device according to the embodiment, each of the first and second memory elements includes a phase-change layer and a diode connected in series with each other.

Furthermore, the device of the embodiment further includes a fifth semiconductor region formed on an opposite side to the first semiconductor region with respect to the first wiring layer, a sixth semiconductor region formed on an opposite side to the third semiconductor region with respect to the second wiring layer, a first isolation region formed below the first wiring layer to isolate the first and fifth semiconductor regions from each other, and a second isolation region formed below the second wiring layer to isolate the third and sixth semiconductor regions from each other, the fourth wiring layer further having an electrical contact with the sixth semiconductor region.

Moreover, in the device according to the embodiment, one of the second memory elements is selected by supplying an electrical power between an associated one of the seventh wiring layers and the third wiring layer with an active level to the second wiring layer and one of the first memory elements is elected by supplying an electrical power between an associated one of the seventh wiring layers and the fourth wiring layer with an active level to the first wiring layer.

Furthermore, in the device according to the embodiment, each of the first and second wiring layers serves as a word line and each of the seventh wiring layers serves as a bit line.

Moreover, the device according to the embodiment has a multilevel wiring structure, each of the first and second wiring layers is formed at a first level, each of the third and fourth wiring layers is formed at a second level that is higher than the first level, each of the fifth and sixth wiring layers is formed at a third level that is higher than the second level, and each of the seventh wiring layers is formed at a fourth level that is higher than the third level.

Hereinafter, embodiments are described in which above semiconductor memory device is applied to a phase-change random access memory device with reference to the drawings.

First Embodiment

A phase-change random access memory device according to a first embodiment of the present invention shown in FIGS. 1 to 5 will be explained.

Figure 2:
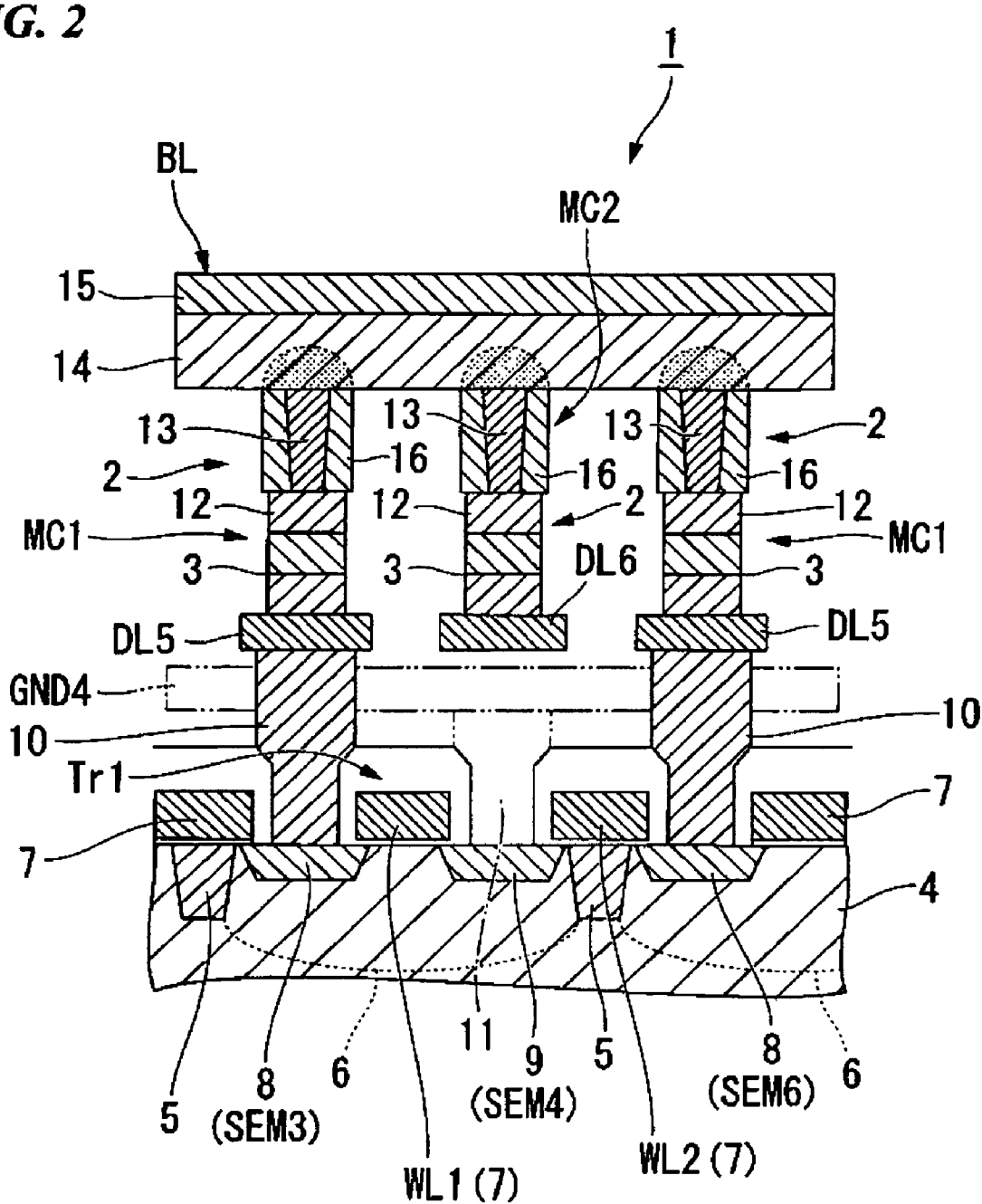
FIG. 2 is a cross-sectional view showing the memory cell shown in FIG. 1.
Figure 3:
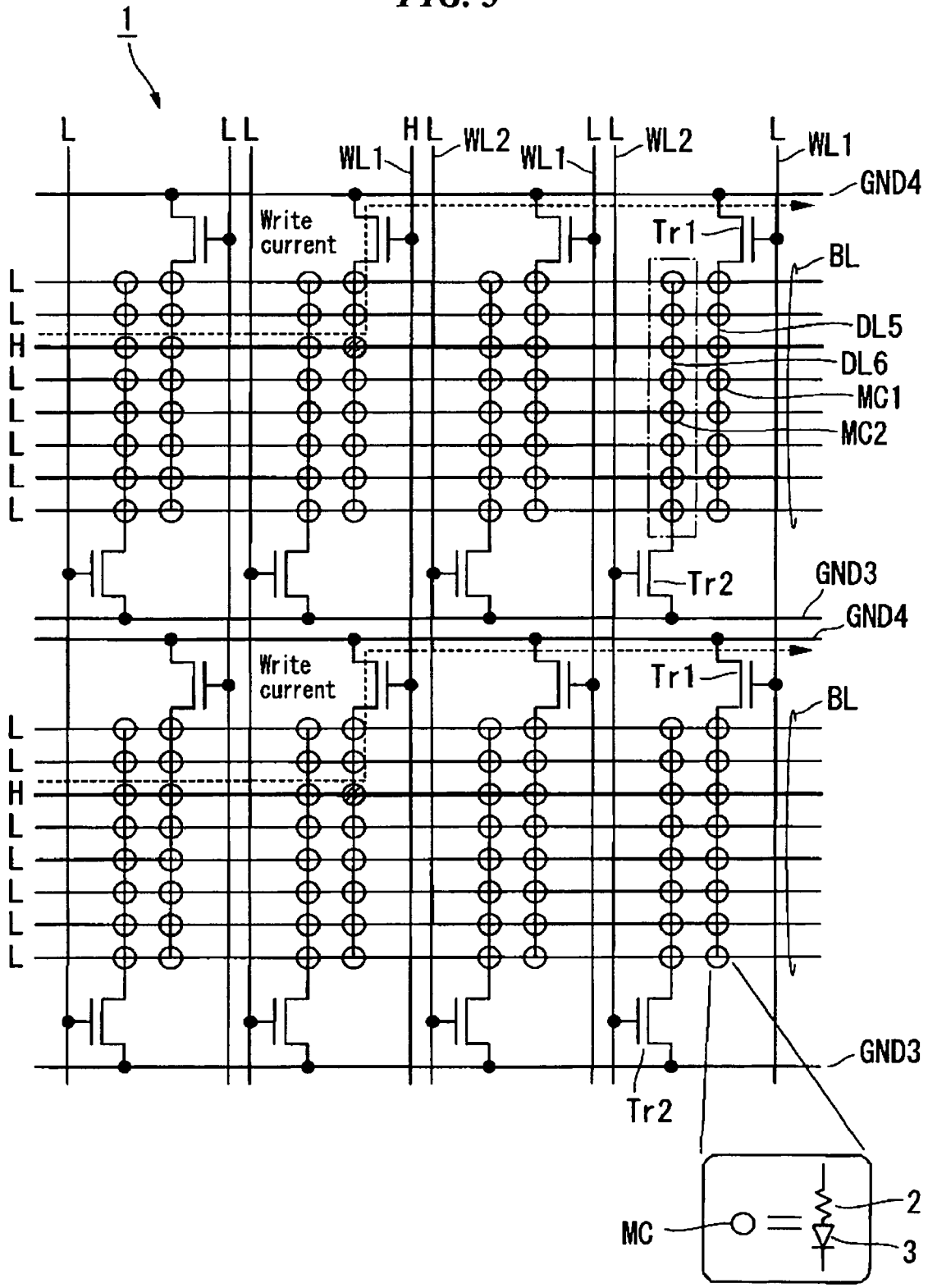
FIG. 3 is a circuit diagram showing an equivalent circuit of the memory cell structure shown in FIG. 1.

As shown in FIGS. 1, 2, and 3, a phase-change random access memory device 1 includes a plurality of word lines (i.e. first wiring layers and second wiring layers) WL1 and WL2, a plurality of bit lines (i.e. seventh wiring layers) BL, a plurality of memory cells (i.e. first memory elements and second memory elements) MC1 and MC2, a plurality of common drain lines (i.e. fifth wiring layers and sixth wiring layers) DL5 and DL6, and a plurality of ground lines (i.e. third wiring layers and fourth wiring layers) GND3 and GND4. The plurality of word lines WL1 and WL2 are arranged in parallel with each other. The plurality of bit lines BL are arranged in parallel with each other above the word lines WL1 and WL2 and orthogonal thereto. The plurality of memory cells MC1 and MC2 are arranged parallel to the word lines WL1 and WL2 and parallel to the bit lines BL, and each of the memory cells MC1 and MC2 includes a phase-change element (i.e. a phase-change layer) 2 and a diode 3 connected in series with each bit line BL. The plurality of common drain lines DL5 and DL6 are arranged below the plurality of memory cells MC1 and MC2 in parallel with the word lines WL1 and WL2, and commonly connect a predetermined number of memory cells MC1 and MC2 that are orthogonal to the bit lines BL. The plurality of ground lines (metal interconnection layers) GND3 and GND4 are arranged below the common drain lines DL5 and DL6 and in parallel with the bit lines BL.

The memory cell structure according to this embodiment of the invention is known as a cross-point cell structure. It is therefore capable of realizing a minimum cell area, specifically a cell size of $4F^2$ (where F is a minimum feature size of a process).

Figure 4:
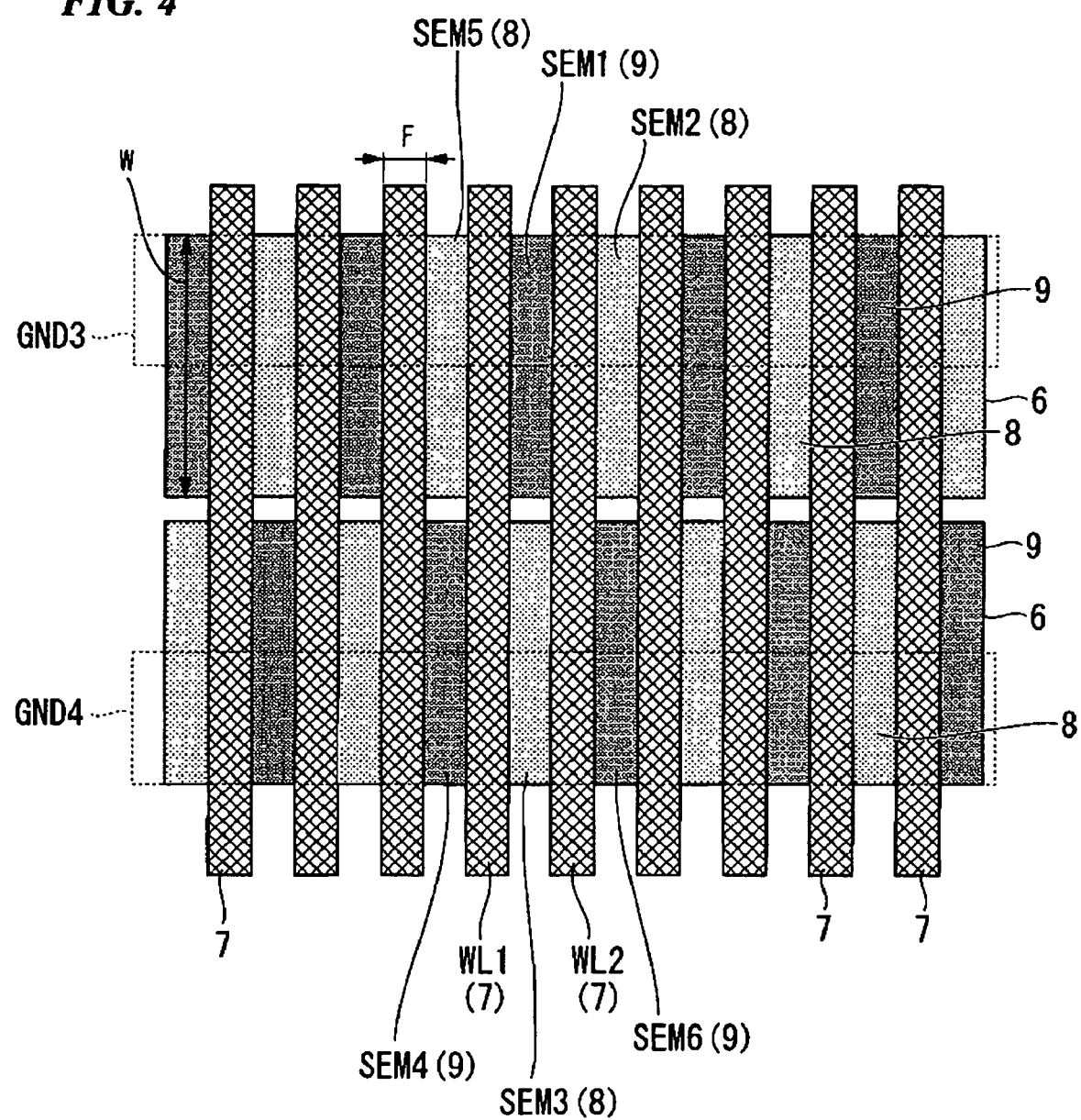
FIG. 4 is a plan view showing a layout of the memory cell structure shown in FIG. 1.
Figure 5:
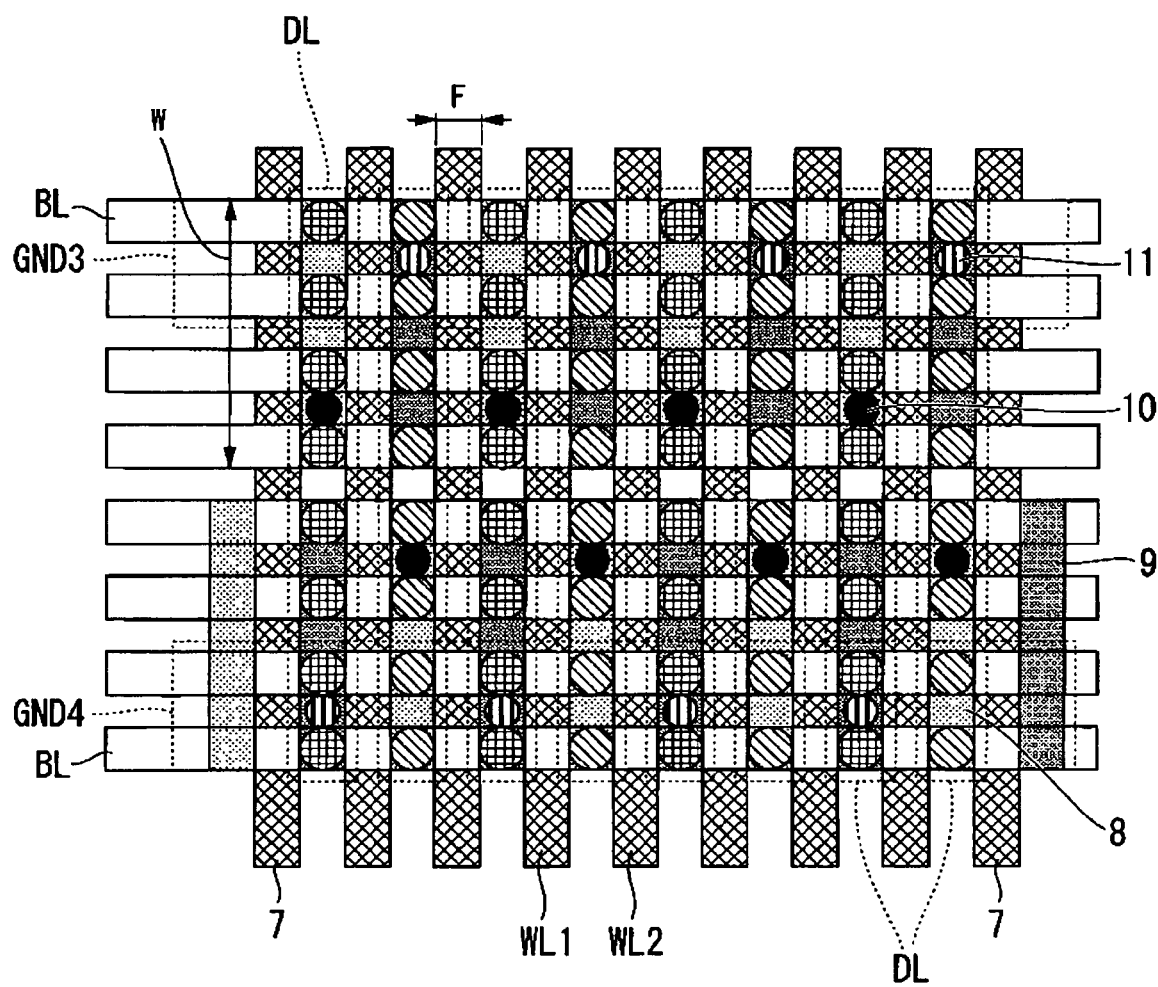
FIG. 5 is a plan view showing a layout of the memory cell structure shown in FIG. 1.

As shown in FIGS. 4 and 5, in this memory cell structure, each memory cell MC1 and MC2 is arranged such that the interval parallel to the word lines WL1 and WL2 and the interval parallel to the bit lines BL are twice the minimum feature size F of the word lines WL1 and WL2 and the bit lines BL respectively. The intervals between word lines WL1 and WL2 and the intervals between bit lines BL are each set at the minimum feature size F.

The common drain lines DL5 and DL6 commonly connect a predetermined number of memory cells MC1 and MC2 that are orthogonal to the bit lines BL across a region corresponding to twice the gate width of switching transistors Tr1 and Tr2, which are described below. The number of memory cells MC1 and MC2 connected to each common drain line DL5 and DL6 can be two, four, eight, or more. In this embodiment, each common drain line DL5 and DL6 commonly connects eight memory cells MC1 and MC2 that are orthogonal to the bit lines BL. Therefore in this embodiment, the size of a region W corresponding to the gate width of the switching transistors Tr1 and Tr2 is 7F.

As shown in FIG. 1 and FIG. 3, the switching transistors Tr1 and Tr2 are MOS transistors. Gates of the switching transistors Tr1 are connected to the word lines WL1, their drains are connected to the common drain lines DL5, and their sources are connected to the ground lines GND4. Gates of the switching transistors Tr2 are connected to the word lines WL2, their drains are connected to the common drain lines DL6, and their sources are connected to the ground lines GND3. In the memory cell structure according to this embodiment of the invention, the switching transistor Tr1 connected to one end of a common drain line DL5, and the switching transistor Tr2 connected to another end of a different common drain line DL6 are arranged in alternation in a zigzag formation. The switching transistor Tr1 connected to one end of a common drain line DL5 and the switching transistor Tr2 connected to another end of a different common drain line DL6 are connected to different ground lines GND4 and GND3.

A cross-sectional structure of a memory cell MC1 in FIG. 2 includes an element-isolation region (i.e. a second isolation region) 5, a diffusion layer 6, a gate electrode 7, a drain region 8 (i.e. a third semiconductor region SEM3), and a source region 9 (i.e. a fourth semiconductor region SEM4) as shown in FIG. 4. The element-isolation region 5 is formed by embedding a silicon oxide film ($SiO_2$) in a surface layer of a silicon (Si) substrate 4. In the diffusion layer 6, elements are isolated by the element-isolation region 5. The gate electrode 7 is formed such that it crosses over the diffusion layer 6 with a gate insulating film formed over the diffusion layer 6 therebetween. The drain region 8 and the source region 9 are formed by implantation of ions into both sides of the diffusion layer 6 with the gate electrode 7 in between them. The gate electrode 7 constitutes a word line (i.e. a first wiring layer) WL1. The drain region 8 is connected to a common drain line DL5 via a contact 10 provided directly above. The source region 9 is connected to a ground line GND4 via a VSS contact 11 provided directly above. Another source region 9 (i.e. a sixth semiconductor region SEM6) is formed on an opposite side to the drain region 8 (i.e. the third semiconductor region SEM3) with respect to another wiring layer (i.e. a second wiring layer) WL2. The third and sixth semiconductor regions SEM3 and SEM6 are isolated each other by the second isolation region 5 formed below the second wiring layer WL2. The fourth wiring layer GND4 has an electrical contact with the sixth semiconductor region SEM6.

A cross-sectional structure of a memory cell MC2 includes an element-isolation region (i.e. a first isolation region) which is not shown in the figures, a diffusion layer which is not shown in the figures, a gate electrode 7, a drain region 8 (i.e. a second semiconductor region SEM2), and a source region 9 (i.e. a first semiconductor region SEM1). The element-isolation region is formed by embedding a silicon oxide film ($SiO_2$) in a surface layer of a silicon (Si) substrate 4. In the diffusion layer, elements are isolated by the element-isolation region. The gate electrode 7 is formed such that it crosses over the diffusion layer with a gate insulating film formed over the diffusion layer therebetween. The drain region 8 and the source region 9 are formed by implantation of ions into both sides of the diffusion layer with the gate electrode 7 in between them. The gate electrode 7 constitutes a word line (i.e. a second wiring layer) WL2. The drain region 8 (i.e. the second semiconductor region SEM2) is connected to a common drain line DL6 via a contact (not shown in the figures)

provided directly above. The source region 9 (i.e. the first semiconductor region SEM1) is connected to a ground line GND3 (not shown in the figures) via a VSS contact (not shown in the figures) provided directly above. Another drain region 8 (a fifth semiconductor region SEM5) is formed on an opposite side to the source region 9 (the first semiconductor region SEM1) with respect to the first wiring layer (i.e. the first wiring layer) WL1. The first and fifth semiconductor regions SEM1 and SEM5 are isolated each other by the first isolation region formed below the first wiring layer WL1. A diode 3 that constitutes each memory cell MC1 and MC2 is formed on the common drain line DL5 and DL6. This diode 3 prevents current from flowing from the common drain line DL5 and DL6 side, along the memory cell MC1 and MC2, and to the bit line BL side. No problems arise if the reverse-direction leakage current value of the diode 3 is slightly high. That is, since the diode 3 need only prevent current that is flowing to the memory cell MC1 and MC2 during writing from flowing to another unselected bit line BL, it is possible to use a Schottky barrier diode or a pn junction diode made of polysilicon and the like. The diode 3 can be formed on the common drain line DL5 and DL6 made of metal interconnection, polysilicon interconnection, etc.

A phase-change element 2 that constitutes each memory cell MC1 and MC2 is fabricated by forming a bottom electrode 13 over the diode 3 with a mid-contact 12 therebetween, forming a phase-change film (GST film) 14 on the bottom electrode 13, and forming a top electrode (metal layer) 15 on the phase-change film 14. Of these, the bottom electrode 13 forms a heater plug (a section which heats by concentration of current) for generating phase-change. The top electrode 15 constitutes a bit line BL. Moreover, in this memory cell MC1 and MC2, by providing an insulating film (side wall) 16 inside the opening where the bottom electrode 13 is provided, the heater is made smaller than the opening diameter, whereby write current is reduced.

In the phase-change random access memory device 1 having a structure such as that described above, a predetermined number (eight bits) of memory cells MC1 and MC2 orthogonal to the bit lines BL are commonly connected by a plurality of common drain lines DL5 and DL 6 that are arranged parallel to the word lines WL. A plurality of ground lines GND3 and GND4 are arranged below the common drain lines DL5 and DL6 and in parallel with them. The switching transistor Tr1 connected to one end of the common drain line DL5, and the switching transistor Tr2 connected to another end of the different common drain line DL6, are arranged in alternation with each other. In addition, the switching transistor Tr1 connected to one end of the common drain line DL5, and the switching transistor Tr2 connected to another end of the different common drain line DL6, are connected to different ground lines GND3 and GND4. Due to this configuration, when performing read/write to memory cells MC1 and MC2 on a same word line WL1 and WL2, current can be prevented from concentrating in a same ground line GND3 and GND4.

For example, in FIG. 3, two memory cells on a same word line WL are in write status. In this case, among the plurality of bit lines BL along the vertical direction, the selected bit lines BL are indicated by H (thick solid line) and the unselected bit lines BL are indicated by L (thin solid line). Among the word lines WL1 and WL2 along the horizontal direction, the selected word line is indicated by H (thick solid line), and the unselected word lines are indicated by L (thin solid line). As indicated by the broken line in FIG. 3, write current flows from the two selected bit lines BL, through the memory cells MC1 and the switching transistors Tr1 and Tr1, to different ground lines GND4 and 4. Therefore in this case, write current from two memory cells MC1 does not concentrate in one ground line GND4 and 4. Thus if bits to which writing is performed simultaneously are selected so that they are separated by eight bits or more each other, each write current will flow to a different ground line GND. As a result, current flow can be prevented from concentrating in one ground line GND.

Each of the plurality of ground lines GND is individually laid out parallel to the bit lines BL. If at least some or all of the plurality of ground lines GND are connected mutually in, for example, a mesh-like formation, resistance can be further reduced.

As described above, in this phase-change random access memory device 1, even when using a cross-point structure that enables the cell size to be reduced, it becomes possible to avoid concentration of read/write current in a same word line WL due to an increase of the number of bits to which reading/writing is performed simultaneously. This enables read/write operations to be performed at high speed.

Second Embodiment

Subsequently, a phase-change random access memory device 51 according to a second embodiment of the invention shown in FIG. 6 will be explained. In the following explanation, like parts to those of the phase-change random access memory device 1 are indicated in FIG. 7 by like reference numerals and descriptions thereof are omitted.

Figure 6:
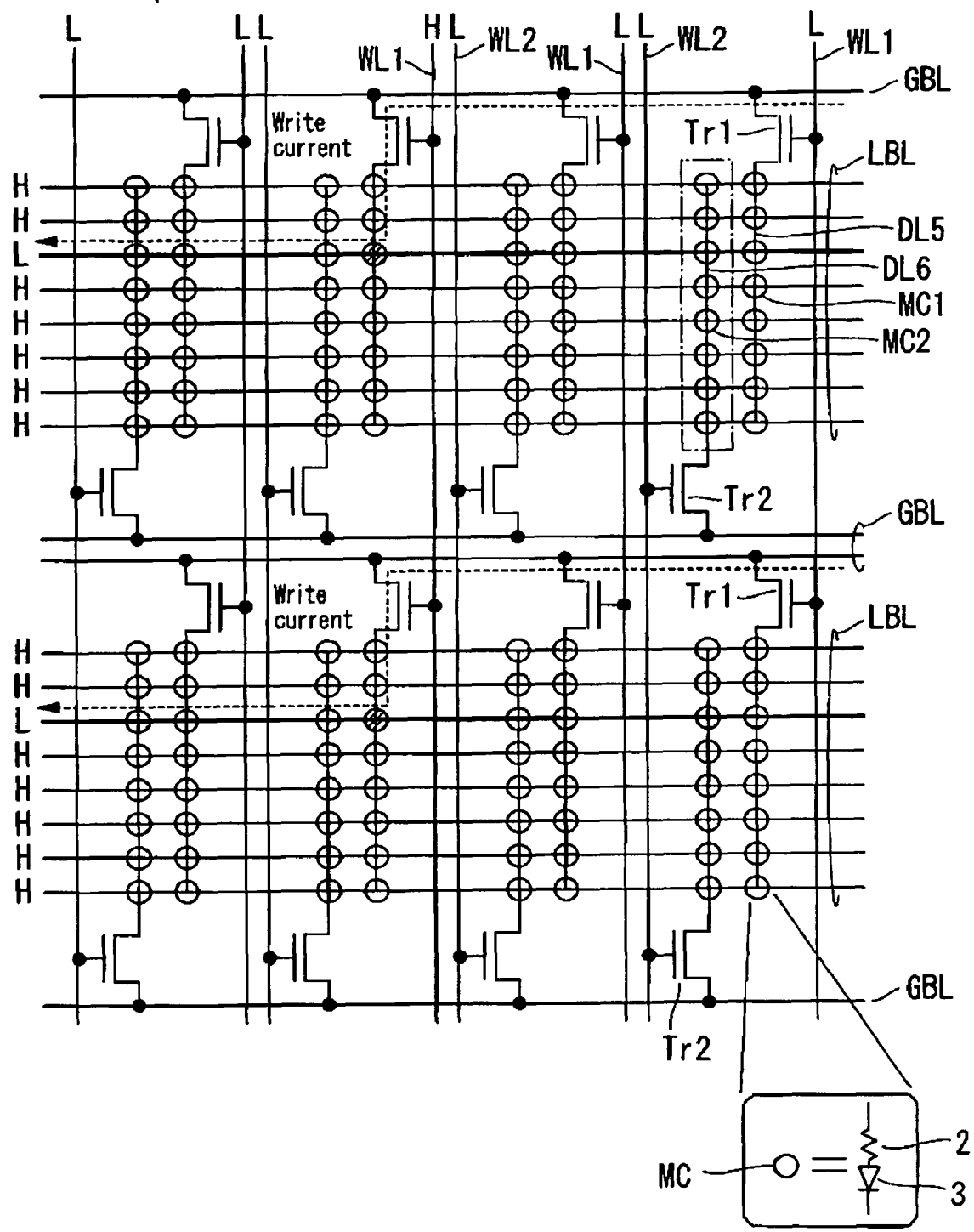
FIG. 6 is a circuit diagram showing an equivalent circuit of a phase-change random access memory device of a second embodiment of the invention.
Figure 7:
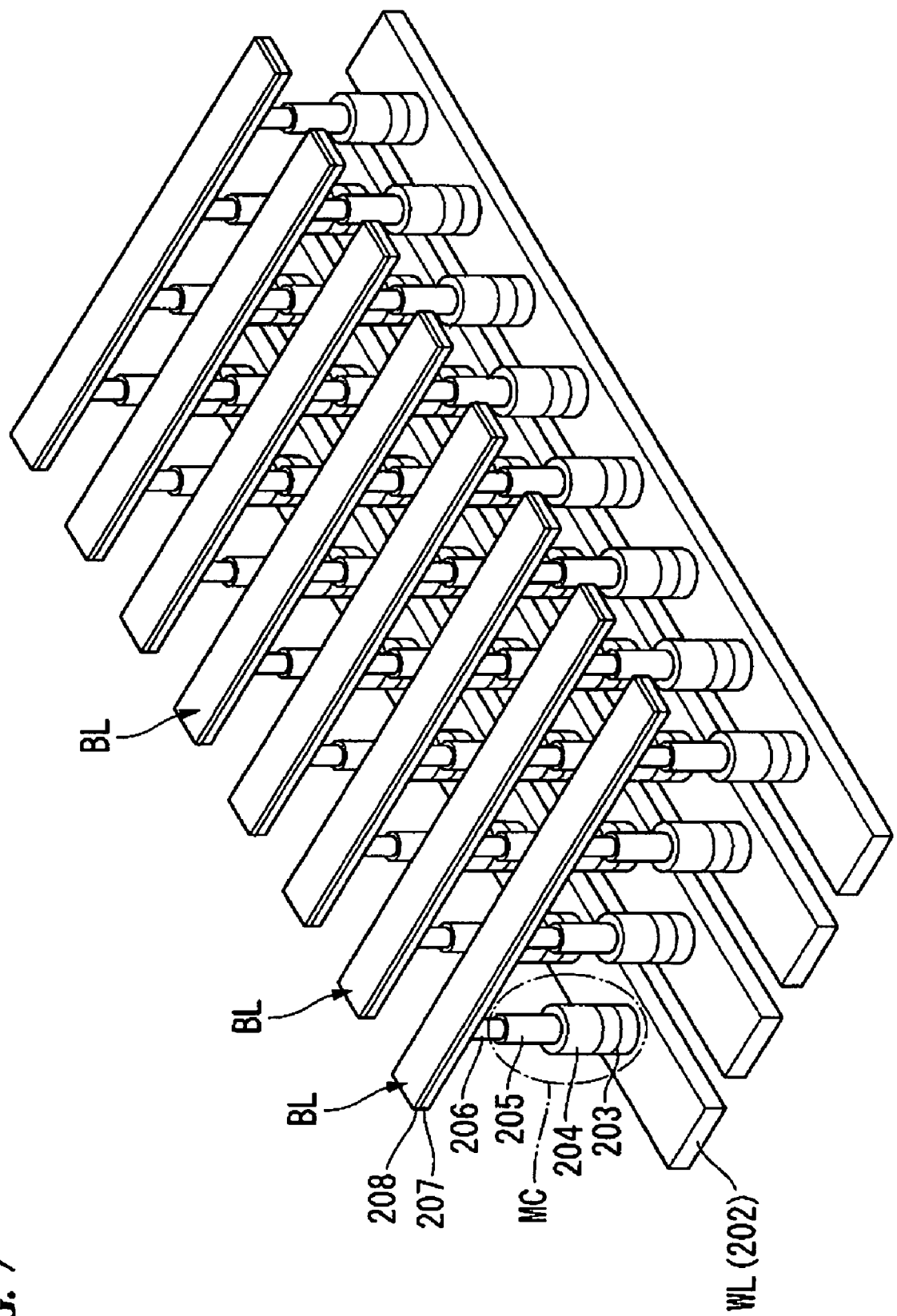
FIG. 7 is a perspective view showing a memory cell structure of a conventional phase-change random access memory device.
Figure 8:
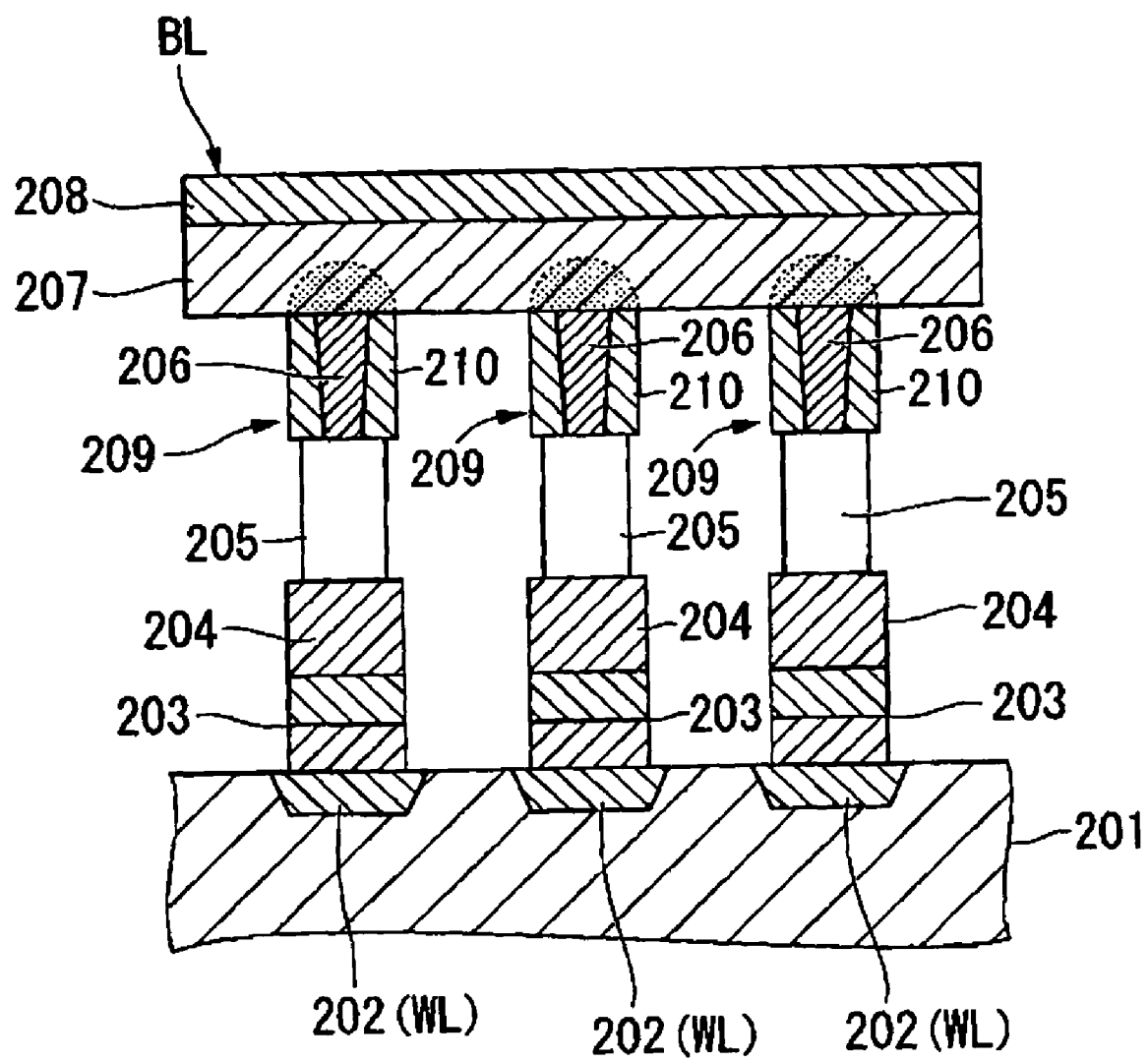
FIG. 8 is a cross-sectional view showing the memory cell shown in FIG. 7.
Figure 9:
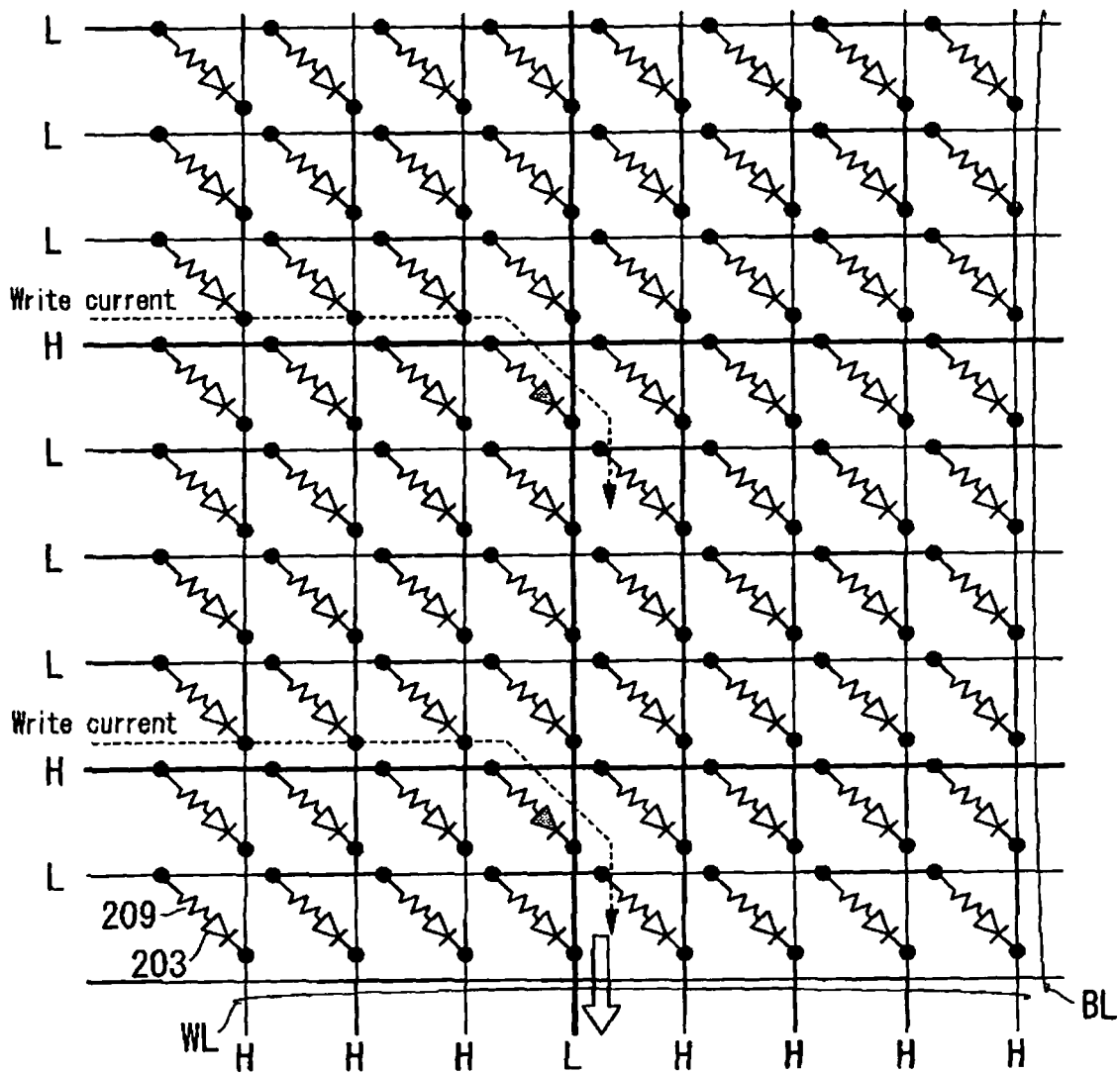
FIG. 9 is a circuit diagram showing an equivalent circuit of the memory cell shown in FIG. 7.

As shown in FIG. 6, in the configuration of the phase-change random access memory device 51, the bit lines BL of the phase-change random access memory device 1 are replaced with local bit lines LBL, and the ground lines GND3 and GND4 of the first embodiment are replaced with global bit lines GBL.

The phase-change random access memory device 51 includes a plurality of word lines WL1 and WL2, a plurality of local bit lines (i.e. a seventh wiring layers) LBL, a plurality of memory cells MC, a plurality of common drain lines DL5 and DL6, a plurality of global bit lines (i.e. third and fourth memory elements) GBL and a plurality of switching transistors Tr1 and Tr2. The plurality of word lines WL are arranged in parallel with each other. The plurality of local bit lines LBL are arranged in parallel with each other above the word lines WL1 and WL2 and orthogonal to them. The plurality of memory cells MC1 and MC2 are arranged parallel to the word lines WL and parallel to the local bit lines LBL, and each of the memory cells MC includes a phase-change element 2 and a diode 3 connected in series with the local bit line LBL. The plurality of common drain lines DL5 and DL6 are arranged below the plurality of memory cells MC1 and MC2 in parallel with the word lines WL1 and WL2, and commonly connect a predetermined number of memory cells MC1 and MC2 that are orthogonal to the local bit lines LBL. The plurality of global bit lines GBL are arranged below the common drain lines DL and in parallel with the local bit lines LBL. The gates of the plurality of switching transistors Tr1 are connected to the word lines WL1, their drains are connected to the global bit lines GBL, and their sources are connected to one end of the common drain lines DL5. The gates of the plurality of switching transistors Tr2 are connected to the word lines WL2, their drains are connected to the global bit lines GBL, and their sources are connected to another end of the common drain lines DL6. The switching transistors Tr1 and Tr2 are arranged in alternation with each other. In addition, the switching transistors Tr1 and Tr2 are connected to different global bit lines GBL.

In this configuration, the capacity of the memory cell portion cannot be seen from the global bit line GBL side. This enables the bit line capacity to be reduced, and enables read operations to be performed at high speed. In this configuration, since the phase-change element (resistor) 2 and the VBE (base-to-emitter voltage) of the diode 3 and the like of the memory cell MC1 and MC2 on the source side increases the potential, the effective current decreases. However, since the gate widths of the switching transistors Tr1 and Tr2 are large, even after subtracting loss due to the rise in the source potential, sufficient current can be obtained.

It is apparent that the present invention is not limited to the above embodiments, but may be modified and changed without departing from the scope and spirit of the invention.

INDUSTRIAL APPLICABILITY

In addition to the phase-change random access memory device (PRAM) mentioned above, the present invention can be applied in a RRAM that stores data by resistance-change, and the like.

What is claimed is:

1. A phase-change random access memory device comprising:
    a plurality of word lines arranged in parallel with each other;
    a plurality of bit lines arranged in parallel with each other above the word lines and orthogonal to the word lines;
    a plurality of memory cells arranged parallel to the word lines and parallel to the bit lines, and each of the memory cells including a phase-change element and a diode connected in series with the bit line;
    a plurality of first and second common drain lines arranged below the plurality of memory cells in parallel with the word lines, and commonly connecting a predetermined number of the memory cells that are orthogonal to the bit lines;
    a plurality of ground lines arranged below the first and second common drain lines and in parallel with the bit lines;
    a plurality of first switching transistors each having a gate connected to associated one of the word lines, a drain connected to associated one of the first common drain lines, and a source connected to associated one of the ground lines; and
    a plurality of second switching transistors each having a gate connected to associated one of the word lines, a drain connected to associated one of the second common drain lines, and a source connected to associated one of the ground lines, the first switching transistors and the second switching transistors being arranged in alternation with each other, and connected to different ground lines.

2. The phase-change random access memory device according to claim 1, wherein the memory cells are arranged such that an interval parallel to the word lines and an interval parallel to the bit lines are twice a minimum feature size of the word lines and the bit lines respectively.

3. The phase-change random access memory device according to claim 1, wherein the first and second common drain lines commonly connect a predetermined number of memory cells that are orthogonal to the bit lines across a region corresponding to twice a gate width of the first and second switching transistors respectively.

4. The phase-change random access memory device according to claim 1, wherein at least some or all of the plurality of ground lines are connected mutually.

5. A phase-change random access memory device comprising:
    a plurality of word lines arranged in parallel with each other;
    a plurality of local bit lines arranged in parallel with each other above the word lines and orthogonal to the word lines;
    a plurality of memory cells arranged parallel to the word lines and parallel to the local bit lines, each of the memory cells including a phase-change element and a diode connected in series with the local bit line;
    a plurality of first and second common drain lines arranged below the plurality of memory cells in parallel with the word lines, and commonly connecting a predetermined number of the memory cells that are orthogonal to the local bit lines;
    a plurality of global bit lines arranged below the first and second common drain lines and in parallel with the local bit lines;
    a plurality of first switching transistors each having a gate connected to associated one of the word lines, a drain connected to one of the global bit lines, and a source connected to associated one of the first common drain lines; and
    a plurality of second switching transistors each having a gate connected to associated one of the word lines, a drain connected to one of the global bit lines, and a source connected to associated one of the second common drain lines, the first switching transistors and the second switching transistors being arranged in alternation with each other, and connected to different global bit lines.

6. The phase-change random access memory device according to claim 5, wherein the memory cells are arranged such that an interval parallel to the word lines and an interval parallel to the local bit lines are twice a minimum feature size of the word lines and the local bit lines respectively.

7. The phase-change random access memory device according to claim 5, wherein the first and second common drain lines commonly connect a predetermined number of memory cells that are orthogonal to the local bit lines across a region corresponding to twice a gate width of the first and second selection transistors respectively.

8. A semiconductor memory device comprising:
    first and second wiring layers extending substantially parallel to each other in a first direction;
    a first semiconductor region formed in a part of a portion that is between the first and second wiring layers;
    a second semiconductor region formed on an opposite side to the first semiconductor region with respect to the second wiring layer and making a pair with the first semiconductor region;
    a third semiconductor region formed in another part of the portion that is between the first and second wiring layers;
    a fourth semiconductor region formed on an opposite side to the third semiconductor region with respect to the first wiring layer and making a pair with the third semiconductor region;
    a third wiring layer extending in a second direction that crosses the first direction and having an electrical contact with the first semiconductor region;
    a fourth wiring layer extending in the second direction and having an electrical contact with the fourth semiconductor region;

a fifth wiring layer extending in the first direction to cross over the first and third semiconductor regions and having an electrical contact with the third semiconductor region;

a sixth wiring layer extending in the first direction in substantially parallel to the fifth wiring layer to cross over the second semiconductor region and having an electrical contact with the second semiconductor region;

a plurality of seventh wiring layers extending in the second direction in substantially parallel to one another, each of the seventh wiring layers intersecting each of the fifth and sixth wiring layers;

a plurality of first memory elements each disposed at an intersection of an associated one of the seventh wiring layers and the fifth wiring layer; and a plurality of second memory elements each disposed at an intersection of an associated one of the seventh wiring layers and the sixth wiring layer.

9. The device as claimed in claim 8, wherein each of the first and second memory elements includes a phase-change layer and a diode connected in series with each other.

10. The device as claimed in claim 8, further comprising a fifth semiconductor region formed on an opposite side to the first semiconductor region with respect to the first wiring layer, a sixth semiconductor region formed on an opposite side to the third semiconductor region with respect to the second wiring layer, a first isolation region formed below the first wiring layer to isolate the first and fifth semiconductor regions from each other, and a second isolation region formed below the second wiring layer to isolate the third and sixth semiconductor regions from each other, the fourth wiring layer further having an electrical contact with the sixth semiconductor region.

11. The device as claimed in claim 8, wherein one of the second memory elements is selected by supplying an electrical power between an associated one of the seventh wiring layers and the third wiring layer with an active level to the second wiring layer and one of the first memory elements is elected by supplying an electrical power between an associated one of the seventh wiring layers and the fourth wiring layer with an active level to the first wiring layer.

12. The device as claimed in claim 11, wherein each of the first and second wiring layers serves as a word line and each of the seventh wiring layers serves as a bit line.

13. The device as claimed in claim 8, the device having a multilevel wiring structure, each of the first and second wiring layers being formed at a first level, each of the third and fourth wiring layers being formed at a second level that is higher than the first level, each of the fifth and sixth wiring layers being formed at a third level that is higher than the second level, and each of the seventh wiring layers being formed at a fourth level that is higher than the third level.

14. A semiconductor memory device comprising:

a plurality of memory cell array areas arranged in a plurality of rows and columns;

plural sets of bit lines, each of the sets of the bit lines being provided correspondingly to each of the rows of the memory cell array areas and extending in a first direction substantially parallel to one another to cross a corresponding one of the rows of the memory cell array areas; and plural pairs of word lines, each of the pairs of the word lines being provided correspondingly to each of the columns of the memory cell areas and extending in a second direction substantially parallel to each other to cross a corresponding one of the columns of the memory cell array areas, the second direction crossing the first direction, each of the memory cell array areas including:

a pair of first lines extending in the second direction substantially parallel to each other to intersect each of the bit lines that crosses a corresponding one of the memory cell array areas;

a plurality of memory elements each disposed at an associated one of the intersections of the first lines and the bit lines that cross a corresponding one of the memory cell array areas;

a pair of second lines extending in the first direction in substantially parallel to each other;

a first transistor connected between one of the first lines and one of the second lines and having a gate connected to one of a corresponding pair of the word lines that cross a corresponding one of the memory cell array areas; and a second transistor connected between the other of the first lines and the other of the second lines and having a gate connected to the other of the corresponding pair of the word lines that cross a corresponding one of the memory cell array areas.

15. The device as claimed in claim 14, wherein each of the memory cells includes a phase change layer and a diode connected in series with each other.

* * * * *